(12) United States Patent
Glazer

(10) Patent No.: US 8,793,642 B2
(45) Date of Patent: Jul. 29, 2014

(54) COMPONENT SELECTION FOR CIRCUIT ASSEMBLY

(75) Inventor: Ran Glazer, Qiryat-Haim (IL)

(73) Assignee: Biosense Webster (Israel), Ltd, Yokneam (IL)

(*) Notice: Subject to any disclaimer, the term of this patent is extended or adjusted under 35 U.S.C. 154(b) by 1252 days.

(21) Appl. No.: 12/646,103

(22) Filed: Dec. 23, 2009

(65) Prior Publication Data
US 2011/0146057 A1 Jun. 23, 2011

(51) Int. Cl.
*G06F 17/50* (2006.01)
*G06F 19/00* (2011.01)

(52) U.S. Cl.
CPC ........ *G06F 17/5068* (2013.01); *G06F 17/5081* (2013.01); *G06F 19/00* (2013.01)
USPC ............... 716/137; 716/136; 716/54; 703/14; 700/96; 700/107; 700/109; 700/121

(58) Field of Classification Search
CPC .. G06F 19/00; G06F 17/5068; G06F 17/5081
USPC ......... 716/137, 136, 54; 703/14; 700/96, 107, 700/109, 121
See application file for complete search history.

(56) References Cited

U.S. PATENT DOCUMENTS

| | | | |
|---|---|---|---|
| 5,443,534 A * | 8/1995 | Vinciarelli et al. | 29/593 |
| 7,203,609 B2 | 4/2007 | Moritani | |
| 7,493,185 B2 * | 2/2009 | Cheng et al. | 700/108 |
| 7,735,033 B2 * | 6/2010 | Zhang et al. | 716/136 |
| 7,840,297 B1 * | 11/2010 | Tuszynski | 700/108 |
| 8,190,465 B2 * | 5/2012 | Lokowandt et al. | 705/7.25 |
| 8,271,103 B2 * | 9/2012 | Hendler et al. | 700/31 |
| 8,367,431 B2 * | 2/2013 | Morisawa et al. | 438/14 |
| 2004/0083083 A1 * | 4/2004 | Doganaksoy et al. | 703/6 |
| 2005/0010546 A1 * | 1/2005 | Nowotny et al. | 707/1 |
| 2005/0288812 A1 * | 12/2005 | Cheng et al. | 700/109 |
| 2007/0078553 A1 * | 4/2007 | Miwa et al. | 700/97 |
| 2008/0221854 A1 * | 9/2008 | Arimoto et al. | 703/17 |
| 2009/0076837 A1 * | 3/2009 | Collier | 705/1 |
| 2010/0121474 A1 * | 5/2010 | Bomholt et al. | 700/104 |

FOREIGN PATENT DOCUMENTS

EP   1 406 373 A2   4/2004

OTHER PUBLICATIONS

Feng Y. et al., "Using Measured Characteristics of Surface Mount Components in Time-Domain Simulation of High Speed Analog Circuit" *Electromagnetic Compatibility* 1:315-320 (Aug. 9, 2004).
Naishadham K. et al., "Measurement-Based Closed-Form Modeling of Surface-Mounted RF Components", *IEEE Transactions on Microwave Theory and Techniques* 50(10):2276-2286 (Oct. 1, 2002).
Extended European Search Report dated Apr. 4, 2011 from related European Application No. 10252185.3.

* cited by examiner

*Primary Examiner* — Phallaka Kik
(74) *Attorney, Agent, or Firm* — Scully, Scott, Murphy & Presser PC

(57) ABSTRACT

A method for assembling an electrical circuit includes measuring actual values of components of a given type that are held in a stock, and storing the measured actual values in a computerized stock-record. An actual property of an electrical circuit under assembly is determined. Based on the determined actual property, and on a specified response of the circuit, a required value is calculated for a set of one or more of the components of the given type. Responsively to the calculated required value, the stock-record is searched, and a set of one or more of the components is selected from the stock and assembled into the circuit.

20 Claims, 3 Drawing Sheets

COMPONENT SELECTION FOR CIRCUIT ASSEMBLY

FIELD OF THE INVENTION

The present invention relates generally to manufacturing of electrical equipment, and more specifically to assembling electrical circuits.

BACKGROUND OF THE INVENTION

In many systems that comprise electrical circuits, the response of the circuits needs to be set with high precision. A common practice for obtaining the response at the desired high precision is to utilize highly accurate electrical components. For example, the CARTO magnetic tracking system produced by Biosense Webster Inc. (Diamond Bar, Calif.) includes resonant circuits comprising coils and capacitors. The resonant frequencies of these circuits need to be set with high accuracy (e.g. 0.5%). A common practice for achieving this high accuracy would be to utilize highly accurate coils and capacitors. Such accurate components, however, may be characterized by low availability and high cost.

SUMMARY OF THE INVENTION

There is provided, in accordance with an embodiment of the present invention, a method for assembling an electrical circuit, including:

measuring actual values of components of a given type that are held in a stock, and storing the measured actual values in a computerized stock-record;

determining an actual property of an electrical circuit under assembly;

calculating a required value for a set of one or more of the components of the given type for assembling into the circuit, based on a specified response of the circuit and the determined actual property;

selecting a set of one or more of the components from the stock by searching the stock-record responsively to the calculated required value; and assembling the set of selected components into the circuit.

Typically, the method further includes removing the actual values of the selected components from the stock-record.

In some embodiments, the components include capacitors, and measuring the actual values includes measuring actual capacitance values of the capacitors.

In some embodiments, determining the actual property includes measuring an actual value.

In some cases, the element of the circuit is a coil, and measuring the actual value includes determining an actual inductance value of the coil.

In other cases, measuring the actual value includes measuring an actual inductance of the circuit.

In some embodiments, selecting the set of the one or more components includes selecting two or more of the components such that the two or more of the components, when assembled into the circuit, will together give the required value.

In other embodiments, the specified response includes a resonant frequency, and calculating the required value includes finding the required value based on the specified resonant frequency.

In some embodiments, the stock includes one or more compartments, wherein each compartment is designated to hold components of a respective type, each compartment contains a plurality of sites, and one or more of the components of the respective type are stored in each site according to their measured actual values.

In some cases, the stock-record comprises tables, wherein each table is associated with a respective compartment, each table comprises entries, each entry is associated with a respective site within the respective compartment, and storing the measured actual values in the stock-record includes storing an actual value of a component, which is held in a given site within a given compartment, in the associated entry of the respective table.

There is also provided, in accordance with an embodiment of the present invention, a system for assembling an electrical circuit, including:

a storage subsystem, which is configured to hold a stock of components of one or more types;

a measurement subsystem, which is configured to measure actual values of the components of a given type that are held in the stock, and to determine an actual property of an electrical circuit under assembly;

a memory, which is coupled to store a stock-record comprising the measured actual values; and a processor, which is configured to calculate a required value for a set of one or more of the components of the given type for assembling into the circuit, based on a specified response of the circuit and the determined actual property, and to select a set of one or more of the components of the given type from the stock for assembly into the circuit by searching the stock-record responsively to the calculated required value.

The present invention will be more fully understood from the following detailed description of the embodiments thereof, taken together with the drawings in which:

DETAILED DESCRIPTION OF THE EMBODIMENTS

System Description

Figure 1:
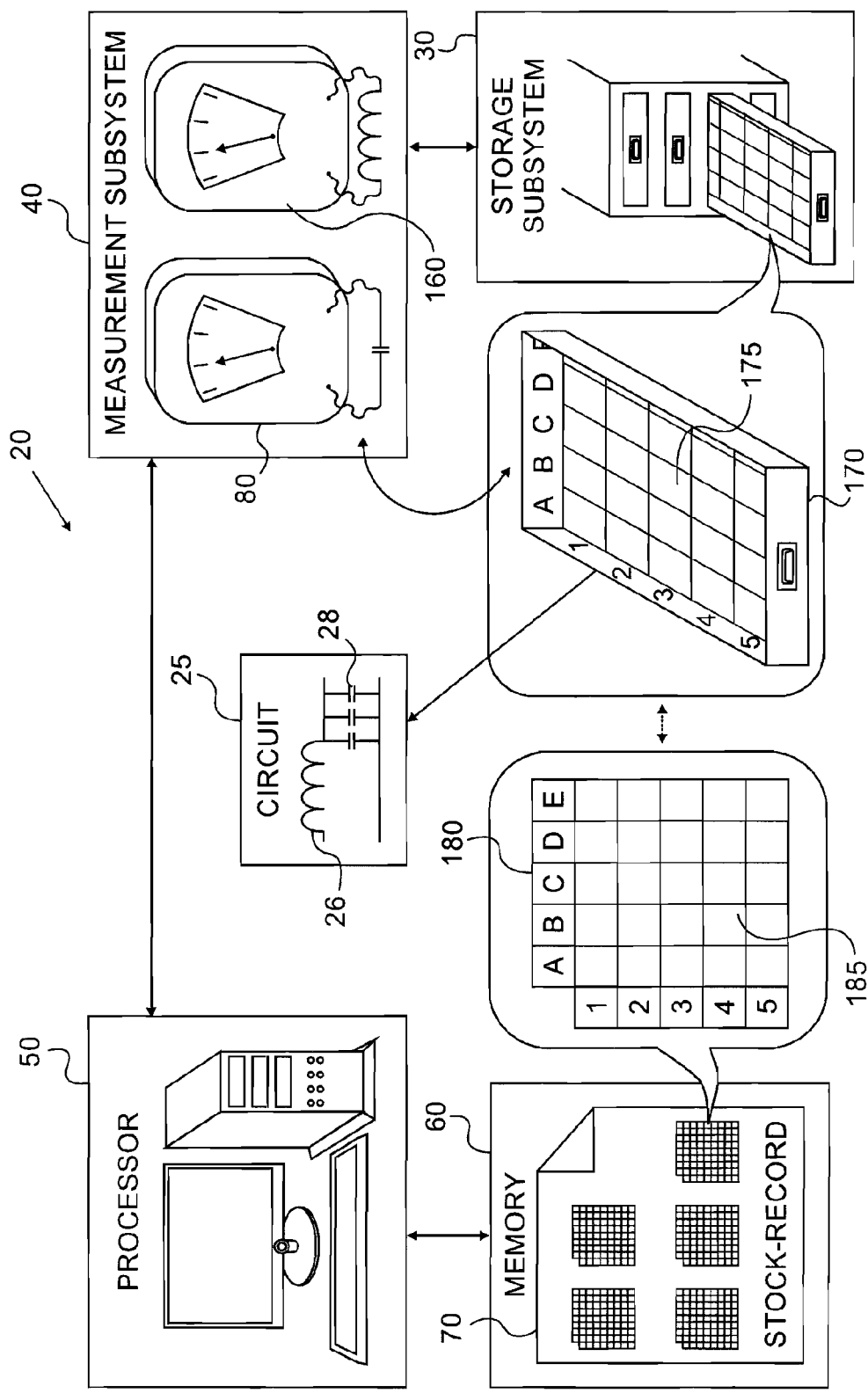
FIG. 1 is a block diagram that schematically illustrates a system for selecting components to be assembled into an electrical circuit, in accordance with an embodiment of the present invention.

FIG. 1 is a block diagram that schematically illustrates a system 20 for selecting components to be assembled into an electrical circuit 25, in accordance with an embodiment of the present invention. Circuit 25 is referred to hereinbelow as the product-circuit, and the selected components are referred to hereinbelow as the product-components. The electrical response of the product-circuit is specified with high precision, meaning that only a small deviation in the actual response of the circuit from its nominal response is permitted. System 20 facilitates achieving the desired high precision of the product-circuit, while utilizing product-components with lower precision.

As an example, system 20 may be adapted for selecting capacitors to be assembled into resonant circuits used to generate magnetic fields in the above-mentioned CARTO, in which the resonant frequencies of the circuits need to be set with high accuracy. This application is described herein in order to illustrate features of the present embodiment, but the principles of this example may also be useful for manufacturing other types of circuits.

The CARTO system uses a "location pad," which includes several magnetic field generators producing magnetic fields at different frequencies. In each generator, circuit 25 is a resonant circuit, comprising a coil 26 and a set of several capacitors 28 connected in parallel. The nominal inductance of the coil and the nominal cumulative capacitance of the capacitors are designed to yield the nominal resonant frequency of the circuit. For example, a nominal resonant frequency of 2,130 Hz may be obtained by using a coil with a nominal inductance of 19 mH, and a set of capacitors with a cumulative nominal capacitance of 293.8505 nF.

Actual values of electrical components typically deviate from their nominal values, and therefore the actual response of the product-circuit may deviate from its desired nominal response. The amount of permissible deviation of the actual response from the nominal response depends on the nature and function of the circuit. Consequently, circuits are usually specified not only by their nominal response, but also by the required precision of their actual response. For example, proper operation of the CARTO system requires high precision of the resonant frequencies, and therefore the resonant circuits are specified with low tolerance of their actual resonant frequencies (e.g., tolerance of 0.5% of the nominal frequency).

A common practice for achieving precise response of a circuit would be to manufacture it from precision components (e.g., building the resonant circuits of the CARTO system from coils and capacitors with tolerance lower than the permitted frequency tolerance). However, such precision components can be expensive and hard to come by. System 20 and the methods described herein enable the assembly of precision product-circuits using less precise product-components, thus reducing production costs and improving delivery times.

Returning to FIG. 1, system 20 comprises a storage subsystem 30, a measurement subsystem 40, a processor 50, and a memory 60. Processor 50 and memory 60 may be implemented, for example, in a personal computer, a computer workstation, or other suitable computing devices. The processor is typically programmed in software to carry out the functions that are described hereinbelow. This software may be downloaded to system in electronic form, over a network for example. Alternatively or additionally, the software may be stored on tangible computer-readable storage media, such as optical, magnetic, or electronic memory media. Further alternatively or additionally, at least some of the functions of processor 50 may be carried out by dedicated or programmable hardware logic.

Storage subsystem 30 holds each individual product-component in a distinguished location, and measurement subsystem 40 measures the actual values of the individual product-components (typically as a preparatory step to storing the product-components in subsystem 30). Under the control of processor 50, the actual value of each individual product-component and its location within storage subsystem 30 are stored in a stock-record 70, which is maintained in memory 60. For example, in cases in which system 20 is adapted for assembly of the resonant circuits of the CARTO system, the product-components comprise capacitors, and measurement subsystem typically comprises a measurement device 80, such as a GenRad RLC Meter 1657/980 (produced by IET Labs, Inc., Westbury, N.Y.), which measures the capacitance of the individual capacitors held in the storage subsystem.

Figure 2:
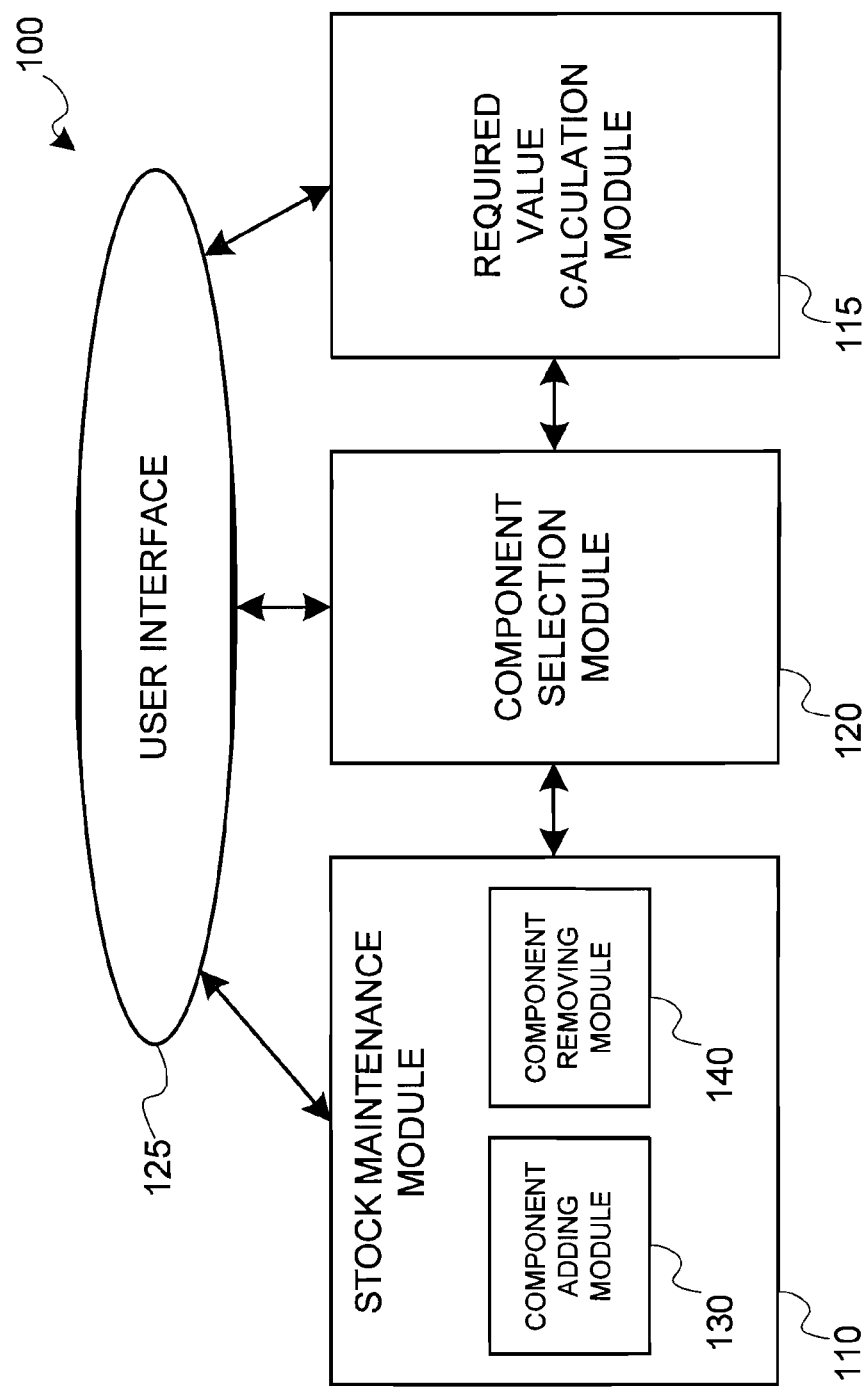
FIG. 2 is a block diagram that schematically illustrates a computer program for controlling a system for selecting components to be assembled into an electrical circuit, in accordance with an embodiment of the present invention.

FIG. 2 is a block diagram that schematically illustrates a computer program 100 for controlling system 20, in accordance with an embodiment of the present invention. Computer program 100, which is executed by processor 50, typically comprises a stock maintenance module 110, a required-value calculating module 115, a component selection module 120, and a user interface 125. Stock maintenance module 110, which is responsible for the maintenance of stock-record 70 (FIG. 1), typically comprises a component adding module 130, which is activated when individual product-components are added to storage subsystem 30, and a component removing module 140, which is activated when individual product-component are selected for assembly and are consequently removed from the storage subsystem. Stock maintenance module 110 may be implemented, for example, by an SQL server program, or by other appropriate software tools.

Measurement subsystem 40 (shown in FIG. 1) also determines an actual property of the product-circuits under assembly. For example, in cases in which system 20 is used for assembly of the resonant circuits of the CARTO system, measurement subsystem 40 typically comprises an inductance measurement device 160, such as the above-mentioned GenRad RLC Meter, which measures the actual inductance values of coils that have been assembled or are to be assembled into the resonant circuits. In some cases, devices 80 and 160 may comprise different devices, and in other cases, they may comprise the same device.

Returning to FIG. 2, required-value calculating module 115 calculates a required value for a set of one or more product-components (such as capacitors) to be assembled into the product-circuit. The required value is calculated, based on the determined actual property (such as the inductance), so that the resulting actual response of the manufactured circuit will meet its specified nominal response to within the required tolerance. According to the calculated required-value, component-selection module 120 searches the stock-record and selects a set of one or more individual components whose actual values collectively match the calculated required-value. Following the selection, and pending user approval and removal of the selected components from the storage subsystem (as applicable), component-removing module 140 removes the respective indications of the selected components from the stock-record, thus keeping the stock-record updated with the current content of the storage-subsystem.

For example, in cases in which system 20 is adapted for assembly of the resonant circuits of the CARTO system, required-value calculating module 115 calculates a required capacitance value, and component-selection module 120 selects a set of capacitors with a matching actual cumulative capacitance. Consequently, system 20 and the methods described herein enable the assembly of accurate resonant circuits using less accurate coils and capacitors, by exploiting the variance of the inaccurate capacitors in order to compensate for the variance of the inaccurate coils.

Stock Management

Returning to FIG. 1, storage subsystem 30 holds each individual product-component in a distinguished location, thus enabling selection of the individual product-components based on their actual, measured values. This is in contrast with common storage systems, where components are differentiated only by their nominal values.

Storage subsystem 30 typically comprises compartments 170 (e.g., drawers), wherein each compartment is designated to hold components of a specific type (i.e., a specific nominal value). Each compartment typically comprises multiple sites (e.g., cells), wherein each cell is configured to hold an individual component or a number of components having the same measured value. For example, each compartment (e.g., drawer) may comprise a matrix of cells 175, wherein each row of the matrix is labeled by a letter (e.g., A, B, C . . . ), and each column is labeled by a number (e.g., 1, 2, 3 . . . ). Additionally or alternatively, other appropriate arrangements of the storage subsystem may be implemented.

The content of storage subsystem 30 is reflected in stock-record 70, which is maintained by processor 50 in memory 60. A given individual component within the storage subsystem is represented in the stock-record by a respective individual-component-entry indicating the type, location, and actual value of the given individual component. For example, the content of drawer 170 within subsystem 30 is represented by a respective table 180 comprising entries 185. Each entry 185 within table 180 corresponds to respective cell 175 within respective compartment 170, and contains the actual value of the individual component residing in that cell (and possibly the number of components in the cell).

Measuring actual component values and storing their data in the stock-record may be performed while adding components to storage subsystem 30. Alternatively, actual values of components that have already been located in storage subsystem 30 may be measured and recorded later.

In typical cases, measurement subsystem 40 is operated manually. In such cases, component data is typically forwarded to computer program 100 via user-interface 125 (shown in FIG. 2). However, in other cases, measurement may be performed automatically, and in such cases, component data may be forwarded automatically, via some appropriate inter-machine interfaces (not shown in the Figure).

Component Selection

A typical process of assembling product-circuit 25 is described hereinbelow. The process is described, as in the preceding embodiments, with reference to FIGS. 1 and 2 and to examples in which system 20 is used in assembly of resonant circuits:

(a) Measurement subsystem 40 (e.g., measurement device 160) determines an actual property of product-circuit 25 being assembled. The determined actual property may be an actual value of an element of the circuit, which has already been selected for assembly within the circuit (for example, an actual inductance of a coil, which has been picked for assembly within a resonant circuit). In some cases, the actual value of the circuit-element may have been determined and recorded in advance, and recalled from the memory when the element is picked for assembly. Additionally or alternatively, the determined actual property of the circuit may be an actual value of the partially assembled product-circuit (for example, an actual inductance value of a resonant circuit, with a coil already assembled within the circuit).

(b) According to the specified response of the circuit, and according to the determined actual property, required-value calculating module 115 calculates a required value for a set of one or more product-components (for example, a required cumulative capacitance value, calculated according to an actual inductance of a picked coil, so that the resulting resonant frequency of the circuit will meet its specified resonant frequency).

(c) Based on the calculated required value, component-selection module 120 scans the stock-record and selects a set of one or more product-components whose actual values collectively match the calculated required value (for example, a set of two, three or four capacitors with actual cumulative capacitance that is within the specified tolerance of the required capacitance value).

In some cases, the policy of the search is adapted for quick response, and the search is concluded when a first "good-enough" set is encountered (e.g., a set with an actual value within a specified tolerance from the required value). In other cases, the policy of the search may be adapted for optimal results, and component-selection module 120 searches the best set (e.g., a set with actual value at minimum distance from the required value). The search policy may be pre-defined or configured by the operator.

In some cases, the selected set of components may require further approval by the operator. If the selected set is not approved, component-selection module 120 may be re-activated to look for alternative sets of components. In other cases, component-selection module 120 may provide the operator with several alternative sets, allowing the operator to choose between them.

Typically, the main criterion employed by the computer and/or the human operator for evaluating a selected set is the distance of the actual value from the required one. However, additional criteria may also be employed. In some cases, selection of the cheapest combination may reduce dramatically the cost of the product-circuit. In other cases, preferring combinations with lower component counts or with smaller collective sizes may reduce the complexity and the size of the product circuit. Stock levels may also be considered by the computer and/or the operator, thus reducing the probability of running into a situation of under- or over-stock of a specific component type or component value. In this case, component selection module 120 may give preference to certain component combinations based on information provided by stock maintenance module 110. Additionally or alternatively, other suitable criteria, such as market availability of specific component types, may be considered. These criteria may be introduced to component-selection module 120 as search-priorities, affecting the order in which the compartments are scan. For example, a compartment may be assign priority levels such as "First Option if Possible", "Normal Use", or "Last Option".

Guided Selection

In embodiments in which component-selection module 120 is configured to output a set of several components, the search process might be time-consuming because of the great number of potential sets. In such cases, component-selection module 120 may utilize a pre-calculated selection-guidebook in order to reduce the number of sets being examined.

Figure 3:
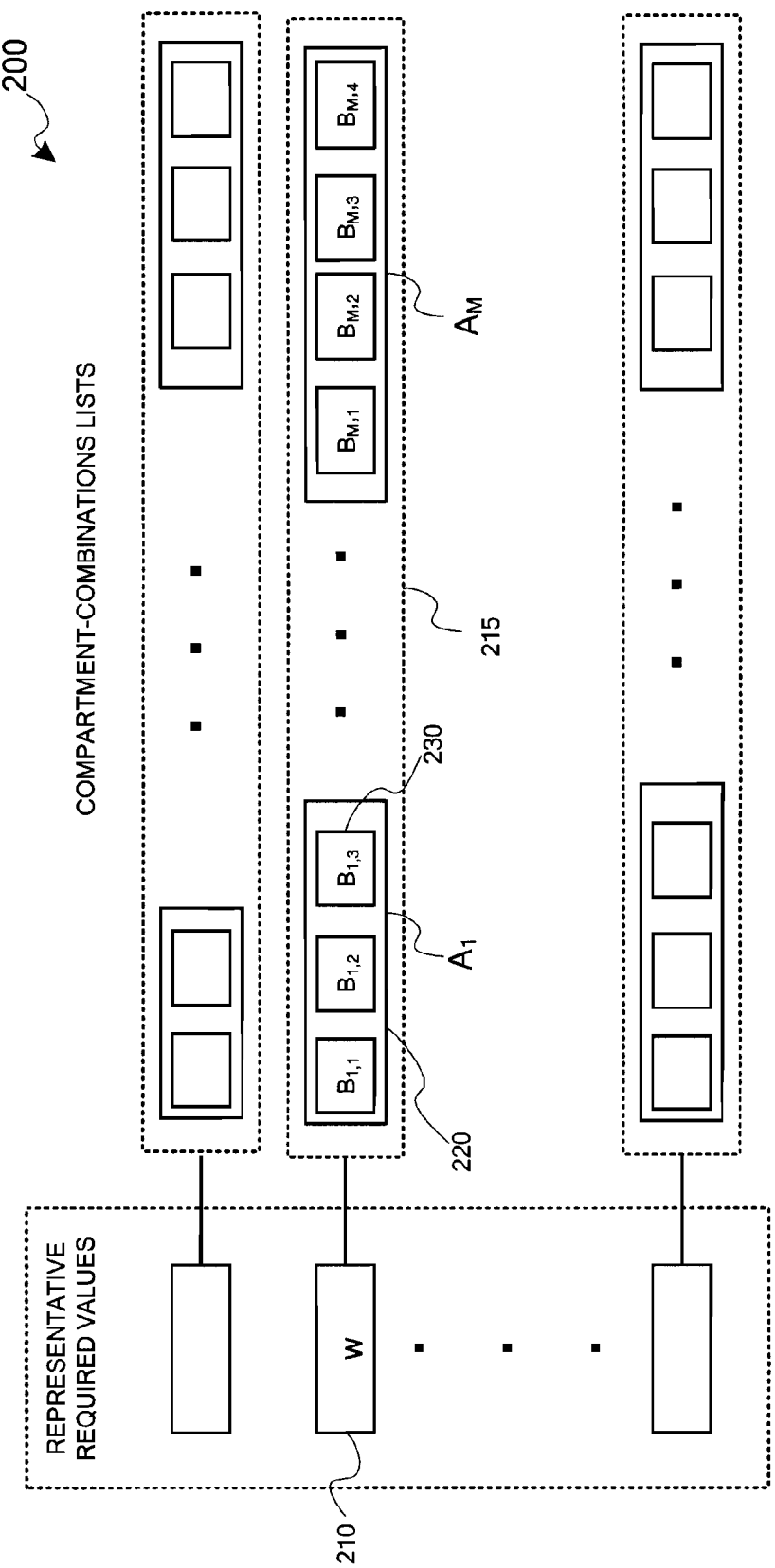
FIG. 3 is a block diagram that schematically illustrates a search-guidebook, in accordance with an embodiment of the present invention.

FIG. 3 is a block diagram showing a selection-guidebook 200, in accordance with an embodiment of the present invention. Selection-guidebook 200 typically comprises a set of representative-required-values 210, which encompass a quantized representation of the range of potential required-values. Each representative-required-value 210 is associated with a list 215 of compartment-combinations 220, and each compartment-combination 220 comprises a set of compartment-pointers 230.

Pre-calculated search-guidebook 200 is utilized as follows: Based on a collective required-value v calculated by required-value calculating module 115, component-selection module 120 finds a representative-required-value w, which is close to v, and constrains its search to sets of product components selected according to the compartment-combinations associated with w. More specifically, let $\{A_m; m=1, 2, \ldots, M\}$ be a list of compartment-combinations associated with representative-required-value w, and let each compartment-combination $A_m$ consist of compartment-pointers $\{B_{m,n}; n=1, 2, \ldots, M_n\}$. Following these notations, component-selection module 120 limits its search to sets of product-components, in which each set consists of an individual product-component selected from each compartment $B_{m,n}$ of some combination $A_m$ associated with w.

In order to be utilized as described above, search-guidebook 200 is constructed to satisfy the condition that if a component-set is selected according to a compartment-combination $A_m$ associated with a representative-required-value w, the collective actual value of the selected component set is close to w.

For example, in cases in which component-selection module 120 is configured to select a set of capacitors for the resonant circuits of the CARTO system, search guidebook 200 is typically constructed as follows:

(a) The range of potential required capacitance values is evaluated, according to the specified resonant frequencies and according to the span of the actual values of the coils of the specific types and the specified tolerance of the resonant frequency.

(b) The range of the potential required capacitance values is quantized, with typical quantization step of 1 nF, depending on the specified tolerance of the resonant frequency, thus producing a list of representative-required-values 210.

(c) A set of permitted compartment-combinations is determined. The number of permitted compartment-combinations depends on the number of compartments and the permitted number of capacitors within a resonant circuit, and may further depend on additional limitations, such as total components size. For example, if the number of compartments is nine, and any combination of three or four compartment is acceptable, the number of permitted combinations is 330

$$\left( \binom{9}{4} + \binom{9}{3} = 126 + 84 = 210 \right).$$

If there are further limitations on the permitted combinations, the set of permitted combinations is reduced accordingly.

(d) Compartment-combinations from the set of permitted combinations are associated with representative-required-values. In some cases, association is based on the nominal values of the specific component types (i.e., the sum of the nominal values needs to be within a specified distance from the representative required value). In other cases, association may be based also on the expected span of the actual values of the components of the specific types (e.g., the specified distance threshold may depend on the expected spans of the components of the specific types).

In the example of the CARTO system, representative-required-value 210 is typically associated with a list 215 of up to 70 component-combinations 220 for each coil resonant frequency. Using guidebook 200 thus results in a great reduction in the response time of the component-selection module.

It will thus be appreciated that the embodiments described above are cited by way of example, and that the present invention is not limited to what has been particularly shown and described hereinabove. Rather, the scope of the present invention includes both combinations and sub-combinations of the features described hereinabove, as well as variations and modifications thereof which would occur to persons skilled in the art upon reading the foregoing description and which are not disclosed in the prior art.

What is claimed is:

1. A method for assembling an electrical circuit, comprising:
    measuring actual values of components of a given type that are held in a stock, and storing the measured actual values in a computerized stock-record;
    determining an actual property of an electrical circuit under assembly;
    calculating, using a processor, a required value for a set of one or more of the components of the given type for assembling into the electrical circuit, based on a specified response of the electrical circuit and the determined actual property;
    selecting, based on the actual values, a set of one or more of the components from the stock by searching the computerized stock-record responsively to the calculated required value; and
    assembling the set of selected components into the electrical circuit.

2. The method according to claim 1, and comprising removing the actual values of the selected components from the computerized stock-record.

3. The method according to claim 1, wherein the components comprise capacitors, and wherein measuring the actual values comprises measuring actual capacitance values of the capacitors.

4. The method according to claim 1, wherein determining the actual property comprises measuring an actual value.

5. The method according to claim 4, wherein an element of the electrical circuit comprises a coil, and wherein measuring the actual value comprises determining an actual inductance value of the coil.

6. The method according to claim 4, wherein measuring the actual value comprises measuring an actual inductance of the electrical circuit.

7. The method according to claim 1, wherein selecting the set of the one or more components comprises selecting two or more of the components such that the two or more of the components, when assembled into the electrical circuit, will together give the required value.

8. The method according to claim 1, wherein the specified response comprises a resonant frequency, and wherein calculating the required value comprises finding the required value based on the specified resonant frequency.

9. The method according to claim 1, wherein the stock comprises one or more compartments, wherein each compartment is designated to hold components of a respective type, wherein each compartment comprises a plurality of sites, and wherein the method comprises storing in each site one or more of the components of the respective type according to the measured actual values.

10. The method according to claim 9, wherein the computerized stock-record comprises tables, wherein each table is associated with a respective compartment, wherein each table comprises entries, wherein each entry is associated with a respective site within the respective compartment, and wherein storing the measured actual values in the computerized stock-record comprises storing an actual value of a component, which is held in a given site within a given compartment, in the associated entry of the respective table.

11. A system for assembling an electrical circuit, comprising:
    a storage subsystem, which is configured to hold a stock of components of one or more types;
    a measurement subsystem, which is configured to measure actual values of the components of a given type that are held in the stock, and to determine an actual property of an electrical circuit under assembly;

a memory, which is coupled to store a stock-record comprising the measured actual values; and a processor, which is configured to calculate a required value for a set of one or more of the components of the given type for assembling into the electrical circuit, based on a specified response of the electrical circuit and the determined actual property, and to select, based on the actual values, a set of one or more of the components of the given type from the stock for assembly into the electrical circuit by searching the stock-record responsively to the calculated required value.

12. The system according to claim 11, wherein the processor is further configured to remove the actual values of the selected components from the stock-record.

13. The system according to claim 11, wherein the components that are held in the stock comprise capacitors, and wherein the measurement subsystem is configured to measure actual capacitance values of the capacitors.

14. The system according to claim 11, wherein the measurement subsystem is configured to measure an actual value of an element of the electrical circuit.

15. The system according to claim 14, wherein the element of the electrical circuit comprises a coil, and wherein the measurement subsystem is configured to measure an actual inductance of the coil.

16. The system according to claim 14, wherein the measurement subsystem is configured to measure an actual inductance of the electrical circuit.

17. The system according to claim 11, wherein the processor is configured to select two or more of the components such that the two or more of the components, when assembled into the electrical circuit, will together give the required value.

18. The system according to claim 11, wherein the specified response comprises a resonant frequency, and wherein the processor is configured to calculate the required value based on the specified resonant frequency.

19. The system according to claim 11, wherein the storage subsystem comprises compartments, wherein each compartment is designated to hold components of a respective type, wherein each compartment comprises a plurality of sites, and wherein each site is adapted to hold one or more of the components of the respective type according to the measured actual values.

20. The system according to claim 19, wherein the stock-record comprises tables, wherein each table corresponds to the respective compartment, wherein each table comprises entries, and wherein each entry comprises an actual value of the individual component held within the respective site of the respective compartment.

* * * * *